(12) United States Patent
Lynn et al.

(10) Patent No.: US 6,673,221 B2
(45) Date of Patent: *Jan. 6, 2004

(54) CYLINDRICAL MAGNETRON TARGET AND APPARATUS FOR AFFIXING THE TARGET TO A ROTATABLE SPINDLE ASSEMBLY

(76) Inventors: David Mark Lynn, 506 E. 45th St., Eagle, ID (US) 83714; Melvin Marion Clarkson, 506 E. 45th St., Boise, ID (US) 83714

( * ) Notice: Subject to any disclaimer, the term of this patent is extended or adjusted under 35 U.S.C. 154(b) by 0 days.

This patent is subject to a terminal disclaimer.

(21) Appl. No.: 10/078,873

(22) Filed: Feb. 19, 2002

(65) Prior Publication Data

US 2002/0112956 A1 Aug. 22, 2002

Related U.S. Application Data

(63) Continuation-in-part of application No. 09/788,060, filed on Feb. 17, 2001, now Pat. No. 6,375,815.

(51) Int. Cl.⁷ .............................................. C23C 14/34
(52) U.S. Cl. ........................... 204/298.21; 204/298.22
(58) Field of Search ........................ 204/298.22, 298.21

(56) References Cited

U.S. PATENT DOCUMENTS 5,591,314 A    1/1997  Morgan et al.
6,375,815 B1 * 4/2002  Lynn et al. ............ 204/298.22

FOREIGN PATENT DOCUMENTS

EP        1 106 893 A1    6/2001

* cited by examiner

Primary Examiner—Rodney G. McDonald
(74) Attorney, Agent, or Firm—Angus C. Fox, III

(57) ABSTRACT

An improved interconnection system for attaching an improved cylindrical magnetron target to a rotatable flanged spindle incorporates an annular extension on the target, which fits over the edge of the spindle flange, facilitates centering the target on the spindle, and helps shield target sealing surfaces. The annular extension terminates in an inwardly-angled circumferential step. The target-spindle interconnection system includes a split clamping collar and a generally annular retainer ring that slidable over the spindle shaft and rotatable against the spindle flange, the retainer ring having external circumferential threads that are angled away from the flange. The split clamping collar has, at one end, an inwardly-angled lip that engages the overhanging step and, at the other end, inwardly-angled, internal, circumferential threads that engage the threads of the retainer ring to draw the target and spindle together as a unified assembly as the retainer ring is rotated.

20 Claims, 7 Drawing Sheets

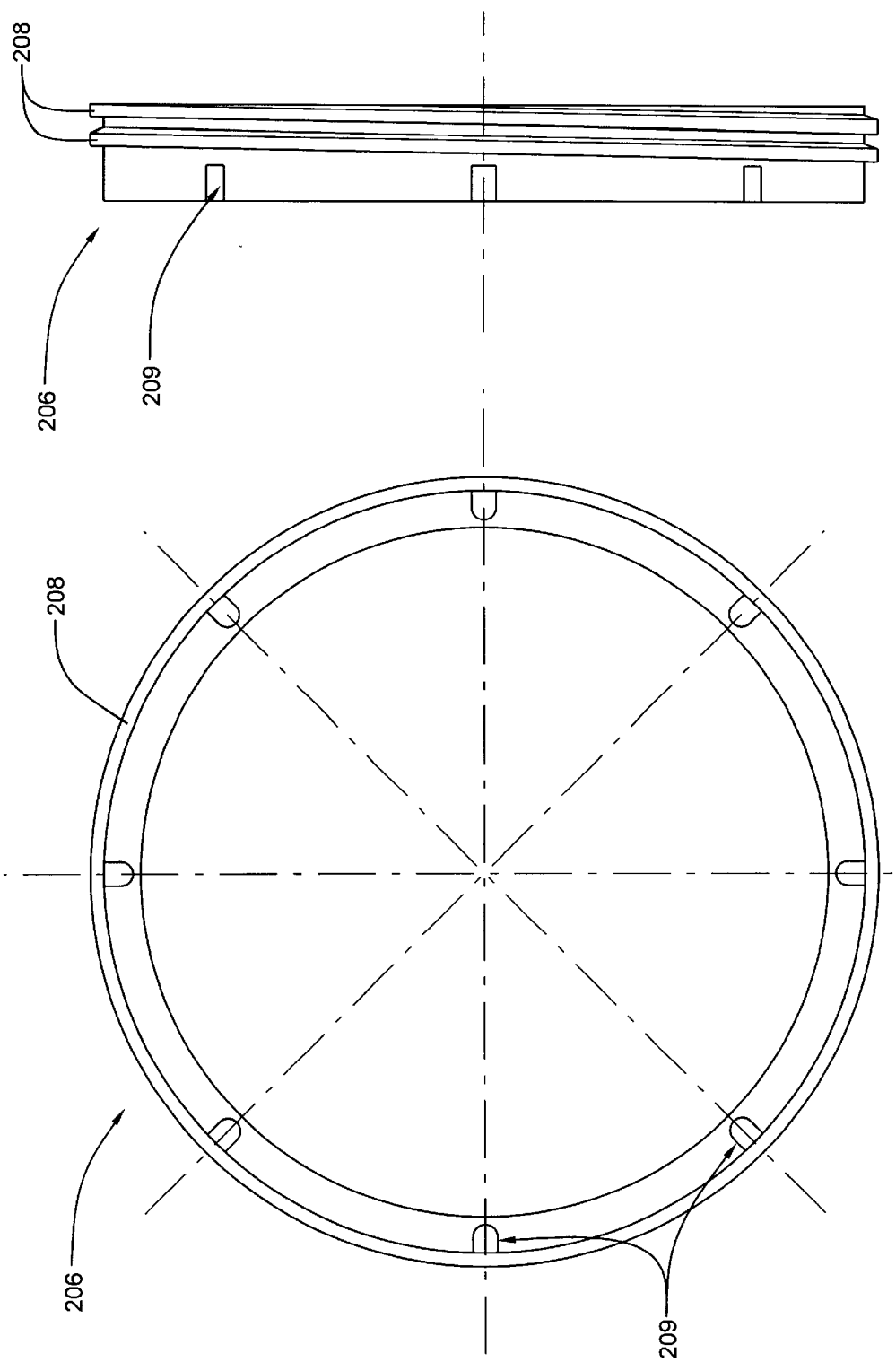

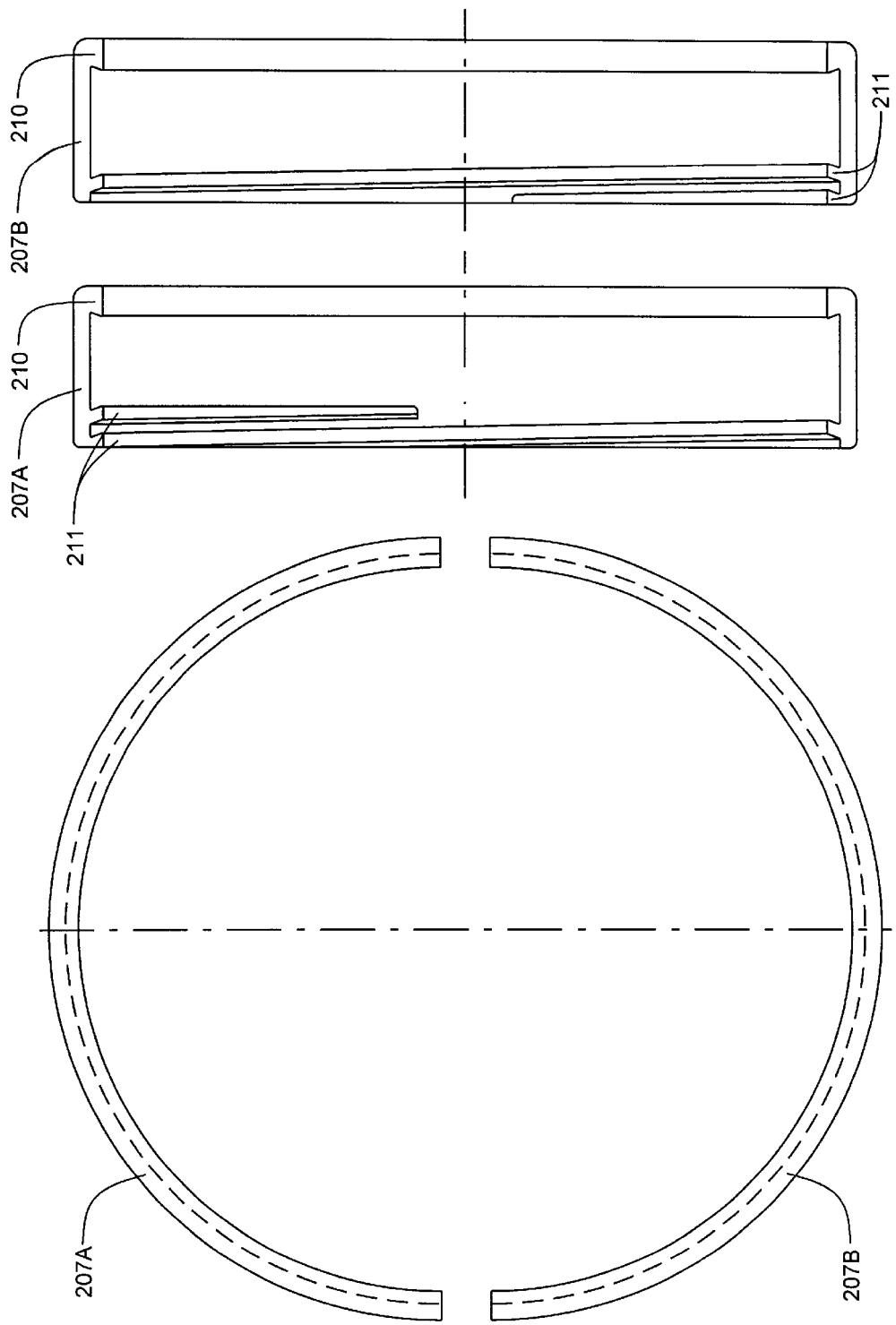

CYLINDRICAL MAGNETRON TARGET AND APPARATUS FOR AFFIXING THE TARGET TO A ROTATABLE SPINDLE ASSEMBLY

This application is as continuation in part of Ser. No. 09/788,060 filed Feb. 17, 2002 now U.S. Pat. No. 6,375,815.

BACKGROUND OF THE INVENTION

1. Field of the Invention

This invention relates generally to equipment employed for the coating of substrate articles by magnetron sputtering and, more specifically, to the design of rotatable targets and target mounting spindles used by such equipment, as well as methods and apparatus for affixing such targets to a target mounting spindle.

2. Description of the Prior Art

For at least several decades, sputtering has been the dominant process for the deposition of thin coatings on large-surface-area substrates, such as architectural glass panels, automobile windshields, and the like. The coating materials are deposited with a magnetron in a vacuum chamber containing a reactive gas. Although planar magnetrons were used initially for sputtering processes, rotating cylindrical magnetrons have now come into wide use. This is because cylindrical magnetrons, though more complex than their planar counterparts, typically feature higher deposition rates, higher material utilization per cathode target, lower maintenance frequency, and greater cost efficiency. Another major advantage of using a rotating cylindrical target, as opposed to a planar target, is that dielectric silicon compounds, such as silicon nitride and silicon dioxide, can be sputtered with ease. Such compounds are extremely difficult to sputter using a planar target.

Rotatable cathode targets used in conjunction with magnetron sputtering equipment are generally hollow cylindrical structures which must be supported and rotatably driven. Although very short cylindrical targets may be supported and driven by a single support spindle, as the targets become longer, support at both ends becomes essential. In addition, support at both ends of a cylindrical target simplifies cooling connections, as coolant fluid can enter the target chamber from one support spindle and exit through the other.

There are two basic types of cylindrical cathode targets in use. The first type is an "unsupported" target, a tubular member fabricated from the material to be sputtered. This type of target is limited to those materials having the mechanical strength for self support over the target length. Another factor which restricts the use of certain materials in unsupported targets is whether or not the material can be readily formed into the target shape. Materials, such as structural metals, that are easily machined and formed, are typical candidates for unsupported targets. Titanium, stainless steel and niobium fall into this category. The second type of cylindrical cathode target, known as a supported target, is used for the sputtering of materials which have poor structural characteristics such as low mechanical strength and softness or characteristics which hamper machining or forming, such as brittleness or extreme hardness. Materials which are generally sputtered from a supported target include gold, silver, copper, manganese, silicon and certain ceramics. These materials must be deposited on a cylindrical backing tube fabricated from a material having sufficient mechanical strength to support both itself and the sputterable material it carries over the target length. Typically, cylindrical backing tubes, or carriers, are manufactured from stainless steel. Deposition of the supported material may be accomplished via one of various known techniques, such as plating, sputtering, or dipping the carrier tube in molten sputterable material. In order to avoid confusion of target genre with the need to support a rotatable target at one or both ends, unsupported targets will hereinafter be referred to as "self-carrying" targets. For the same reason, supported targets, which require the use of a backing tube, will hereinafter be referred to as "carried" targets.

Various mechanisms for supporting, rotating, cooling and energizing a cylindrical target structure in a magnetron, are described in U.S. Pat. No. 5,096,562 to Boozenny, et al. The structure employs a removable support spindle at each end of the cylindrical target structure. A first support spindle at one end supplies and withdraws cooling fluid from within the cylinder and contains a driving mechanism to rotate it, while a second support spindle at the other end contains the electrical power connection to the target surface.

An improved apparatus to releasably affix a rotatable cylindrical magnetron target to a support spindle is disclosed in U.S. Pat. No. 5,591,314 to Morgan, et al. The inventors claim that a primary disadvantage of the Boozenny, et al. design is frequent breakdowns caused by coolant leaks at the interface between the first support spindle and the cylindrical target structure. The leaks are due to the fact that one side of any seal at the spindle-to-target interface is subjected to the low pressure present within the deposition chamber, while the other side of the seal is subjected to high coolant pressure. The Morgan, et al. apparatus supposedly improves on the Boozenny, et al. apparatus by providing a removable coiled wire thread connection system, by employing a single coolant seal ring, to which uniform pressure is applied as the target is attached to the support spindle. For a preferred embodiment, the target, the spindle, and the coiled wire thread are made from dissimilar materials.

Though the Morgan, et al. apparatus seems to be a significant improvement over the Boozenny, et al. apparatus, there are several disadvantages associated with the design of the former. Firstly, the use of the coiled wire thread requires that a spiral groove be machined in the cylindrical target body, thereby weakening the structure. The thickness of the target cylinder at the deepest point of the groove is only about 1.0 millimeter (0.030 inch). Secondly, the target body sealing surface is on a circumferential edge thereof. As the edge has little surface area, it is easily nicked. Nicks in the sealing surface may well cause coolant leaks. Thirdly, the coupling arrangement between target and spindle does not permit the transfer of large torque loads. Fourthly, the threaded coupling arrangement does not lend itself to evenly distributed clamping forces between the target and the spindle.

What is needed is are new cylindrical target and spindle designs which eliminate the disadvantages of the prior art targets and spindles.

SUMMARY OF THE INVENTION

The present invention includes a method and apparatus for attaching a rotating cylindrical magnetron cathode target to an existing, rotatable flanged support spindle. Because the invention may be applied to cylindrical targets of both the carried and self-carrying types, the word "target" should be understood to include a "target carrier" unless the latter is specifically excluded. The invention may also be practices with targets that are supported at one or both ends. It should also be understood that if a target is supported at both ends, the attachment method and apparatus for both ends are either identical or mirror images of one another. Several design improvements have been incorporated into the magnetron target of the present invention, and the attachment apparatus is specifically designed to couple the improved magnetron target to an existing flanged support spindle.

The objectives in creating the improved magnetron target and attachment apparatus have been to improve the reliability of a rotating cylindrical target or target carrier by reducing the likelihood of coolant leaks between the support spindle and the target, decrease the time required to change out an installed target, improve the structural integrity of the target, and provide a target-spindle unifying clamp system which provides more even distribution of clamping pressure, thereby permitting the transfer of much larger torque loads from the spindle to the target.

The improved target includes a circumferential shoulder which, for a preferred embodiment of the invention, includes an extensive circumferential lip which fits over the spindle's outer mating circumferential edge. This lip affords additional protection to a circumferential sealing surface on the target, so that it is less likely to become mechanically damaged. The shoulder terminates in a circumferential, inwardly-angled, overhanging step. The target and spindle are coupled together with an generally annular retainer ring having external, outwardly-facing circumferential threads, and a split clamping collar having an inwardly-angled clamping ledge at one end thereof that mates with the overhanging circumferential step on the target, and internal, inwardly-facing circumferential threads at the other end, which mate with the external threads of the retainer ring. The retainer ring is rotated with a spanner wrench so as to engage the threads of the split clamping collar. As the retainer ring engages the rear face of the spindle flange, the clamping collar and retainer ring act in concert to draw the target and spindle together as a unified assembly. As the target and spindle are drawn together, the circumferential sealing edge of the target compresses an O-ring seal set within an annular groove in the spindle.

BRIEF DESCRIPTION OF THE DRAWINGS

FIG. 3 is a rear elevational view of the retainer ring;

FIG. 4 is a side elevational view of the retainer ring;

FIG. 5 is a front elevational view of the two-piece split collar;

FIG. 6 is a side elevational view of the interior of a first half of the split collar;

FIG. 7 is a side elevational view of the interior of the second half of the split collar;

PREFERRED EMBODIMENT OF THE INVENTION

The present invention includes an improved cylindrical magnetron target and an apparatus and method for coupling at least one end of the improved target to a rotatable support spindle. In the case of a double support system, the target is coupled to a pair of support spindles, with one support spindle being coupled to each end of the target. Also in the case of a double support system both spindle-to-target interfaces will be either identical or mirror images of one another. The target, attachment apparatus and method of using the apparatus will now be described in detail with reference to the attached drawing FIGS. 1 through 8.

Figure 1:
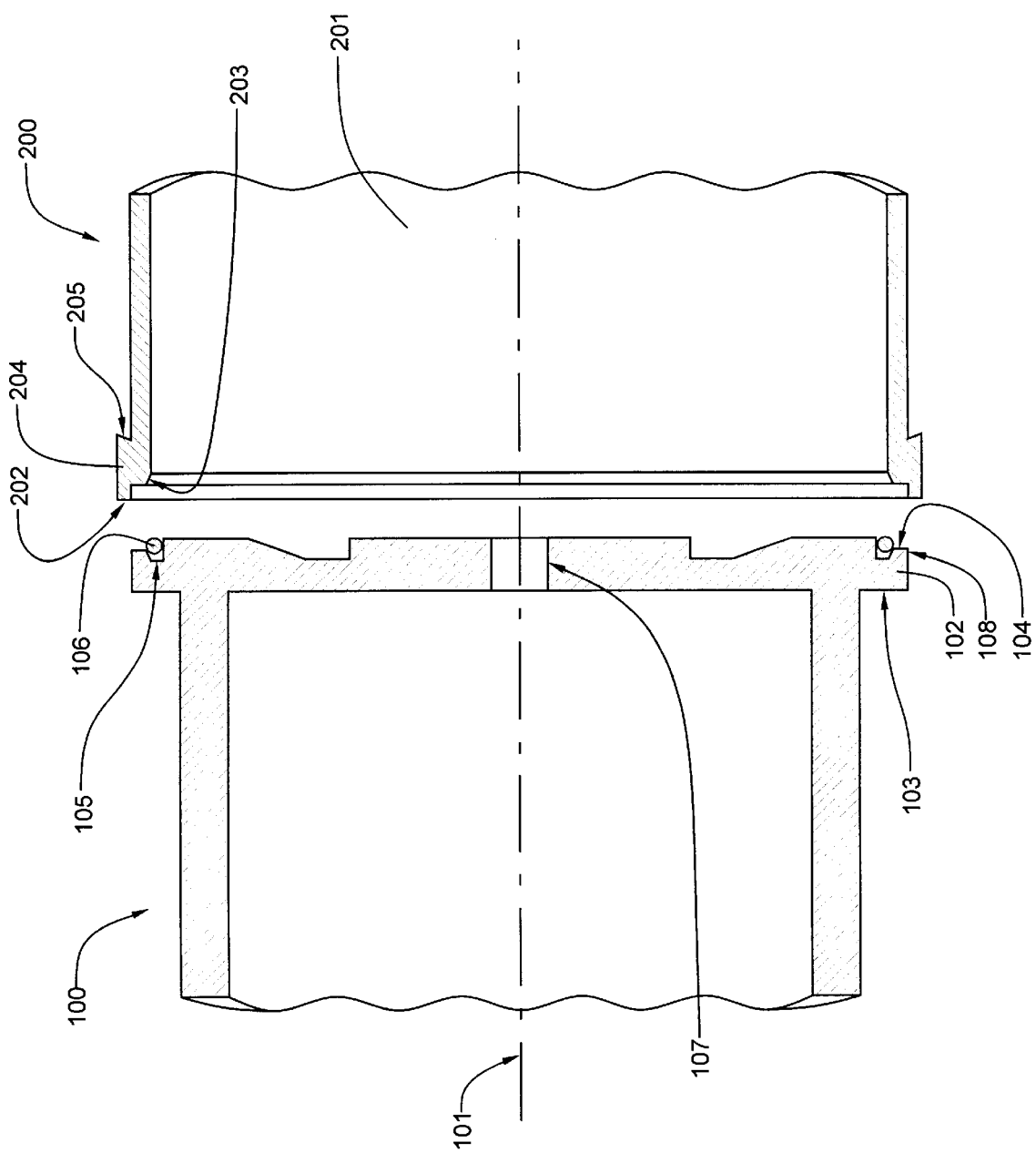
FIG. 1 is a cross-sectional view of an improved magnetron target separated from a rotatable support spindle.

Referring now to FIG. 1, a rotatable support spindle 100 and the improved magnetron target are aligned for assembly into a single unit. The support spindle 100, which is generally radially symmetrical about axis 101, includes a circumferential flange 102 at a target attachment end thereof, said flange having both a rear face 103 and a front face 104. The front face 104 of flange 102 incorporates a circumferential groove 105 in which is inserted a compressible O-ring seal 106. It will be noted that the support spindle 100 is equipped with axial aperture 107, through which coolant fluid may be pumped into the target chamber 201. The improved magnetron target 200, which is also radially symmetrical about axis 101, incorporates an circumferential lip 202 at a spindle attachment end thereof, said lip fitting over the front edge 108 of the spindle flange 102. The lip 202 facilitates accurate axial positioning of the target 200 on the support spindle 100, and also shields a circumferential sealing surface 203, which contacts O-ring seal 106, from mechanical damage in the form of scratches, nicks and dents. If the sealing surface 203 were to become damaged, the O-ring 106 may not be able to effectively seal the joint between the support spindle 100 and the target 200, when the two units are joined. The lip 202 extends from a circumferential shoulder 204, which terminates in an inwardly-angled, overhanging circumferential step 205.

Figure 2:
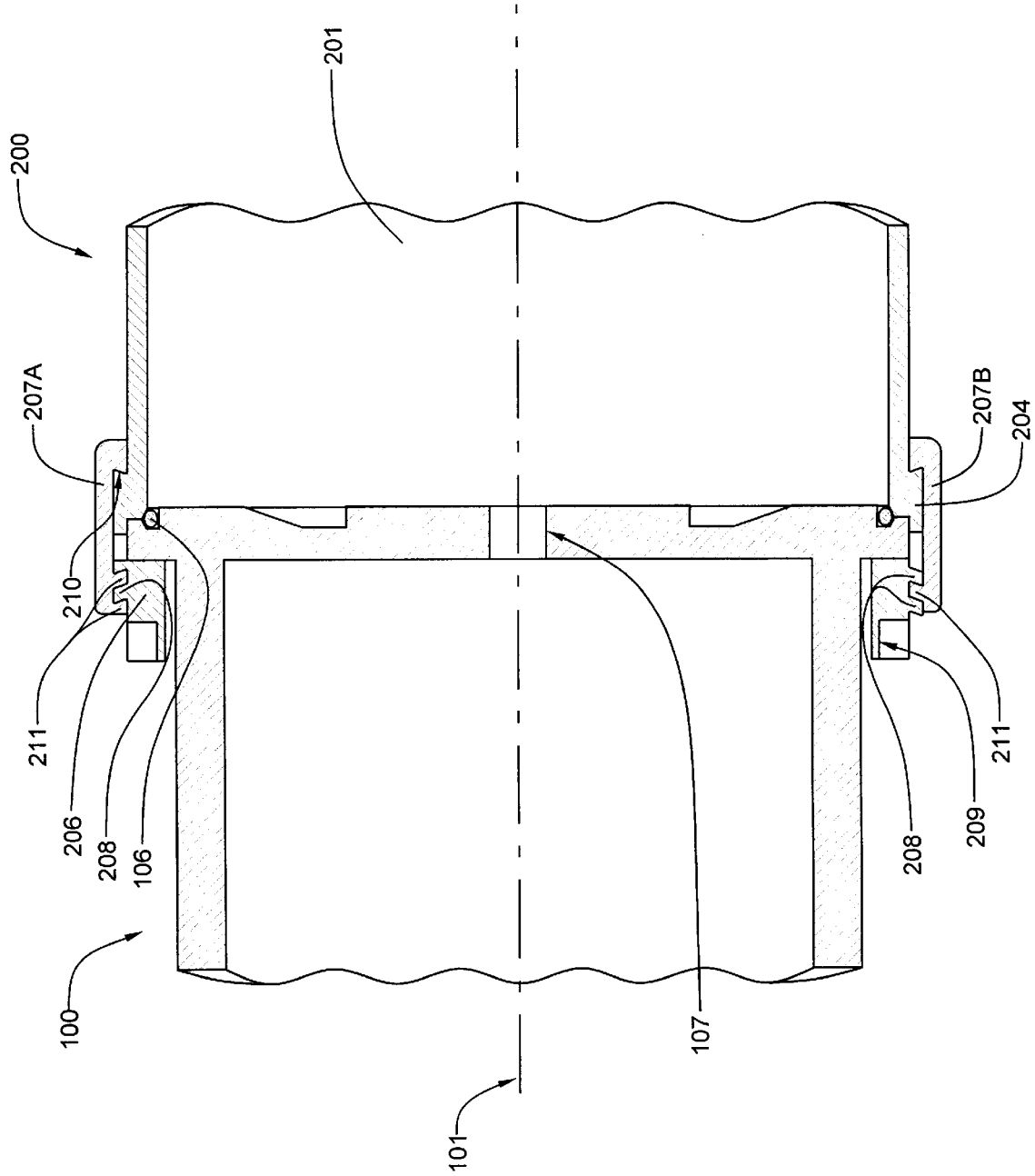
FIG. 2 is a cross-sectional view of the improved magnetron target and spindle of FIG. 1, having been joined with a unique attachment apparatus that includes an internally-threaded split collar and an externally-threaded retainer ring.

Referring now to FIG. 2, the support spindle 100 and the magnetron target 200 are shown as a unified assembly, being joined with the attachment apparatus of the present invention. The target-spindle attachment apparatus includes a retainer ring 206 and a split clamping collar coaxial with the target 200, said collar consisting of a first half collar 207A and a second half collar 207B. The retainer ring 206 is sized so that it is slidable over the spindle shaft 108 so that it can axially rotate against the rear face 103 of the spindle flange 102. The retainer ring 206 incorporates external circumferential spiral threads 208 of generally parallelogram cross section that are angled away from the spindle flange 102. The retainer ring 206 also incorporates a plurality of recesses 209 about its periphery, which can be engaged by a spanner wrench (not shown). The split clamping collar 207A/207B incorporates, at one end thereof, an inwardly-angled clamping ledge 210, that engages the overhanging circumferential step 205 of the target 200. The other end of the split clamping collar 207A/207B incorporates internal, inwardly-angled, spiral, circumferential threads 211, also of generally parallelogram cross section, that engage the external threads 208 of retainer ring 206 as the latter is rotated counterclockwise, as viewed toward the rear of spindle flange 102. As the retainer ring 206 is further rotated, the retainer ring 206 eventually presses against the rear face 103 of spindle flange 102, thereby drawing the clamping ledge 210 of the split clamping collar 207A/207B toward the support spindle 100, and clamping the support spindle 100 and the improved magnetron target 200 together as a unified assembly. The remaining drawing figures, which more clearly show the various components, will clarify the structure of the attachment apparatus and the implementation thereof.

Referring now to FIGS. 3 and 4, the structure of the retainer ring 206 is shown in greater detail. The external threads 208 are shown as being of left-handed configuration. However, if the target is supported at both ends it may be deemed appropriate to use threads of a right-handed configuration for the opposing spindle. In any case, the handedness of the threads may be selected for each target-to-spindle interface so as to minimize the likelihood each retainer ring 206 will loosen as the unified support spindle 100 and magnetron target 200 assembly is accelerated to operating rotational speeds.

Referring now to FIGS. 5, 6 and 7, the structure of the split clamping collar 207A/207B is shown in greater detail. Though the clamping collar might be configured as more than two arcuate segments, two 180-degree segments are most convenient, as fewer parts must be retained in proper position during assembly. When the ends of clamping collar halves 207A and 207B are mated together so that clamping ledge 210 of each is aligned, the internal threads 211 of one collar half 207A or 207B are continuous with those of the other collar half. In order to properly install the clamping collar 207A/207B on the improved target 200, the two halves of the collar are slipped over the target 200 and, with the target 200 held against the face of spindle 100, the two collar halves 207A/207B are slid toward the spindle until the clamping ledge 210 engages the circumferential step 205 of the target 200. The retainer ring 206 is then rotated counterclockwise until its external threads 208 engage the internal threads of the split clamping collar halves 207A/207B. Further rotation of the retainer ring 206 eventually secures the clamping collar halves 207A/207B and the engaged target 200 to the support spindle 100.

Figure 8:
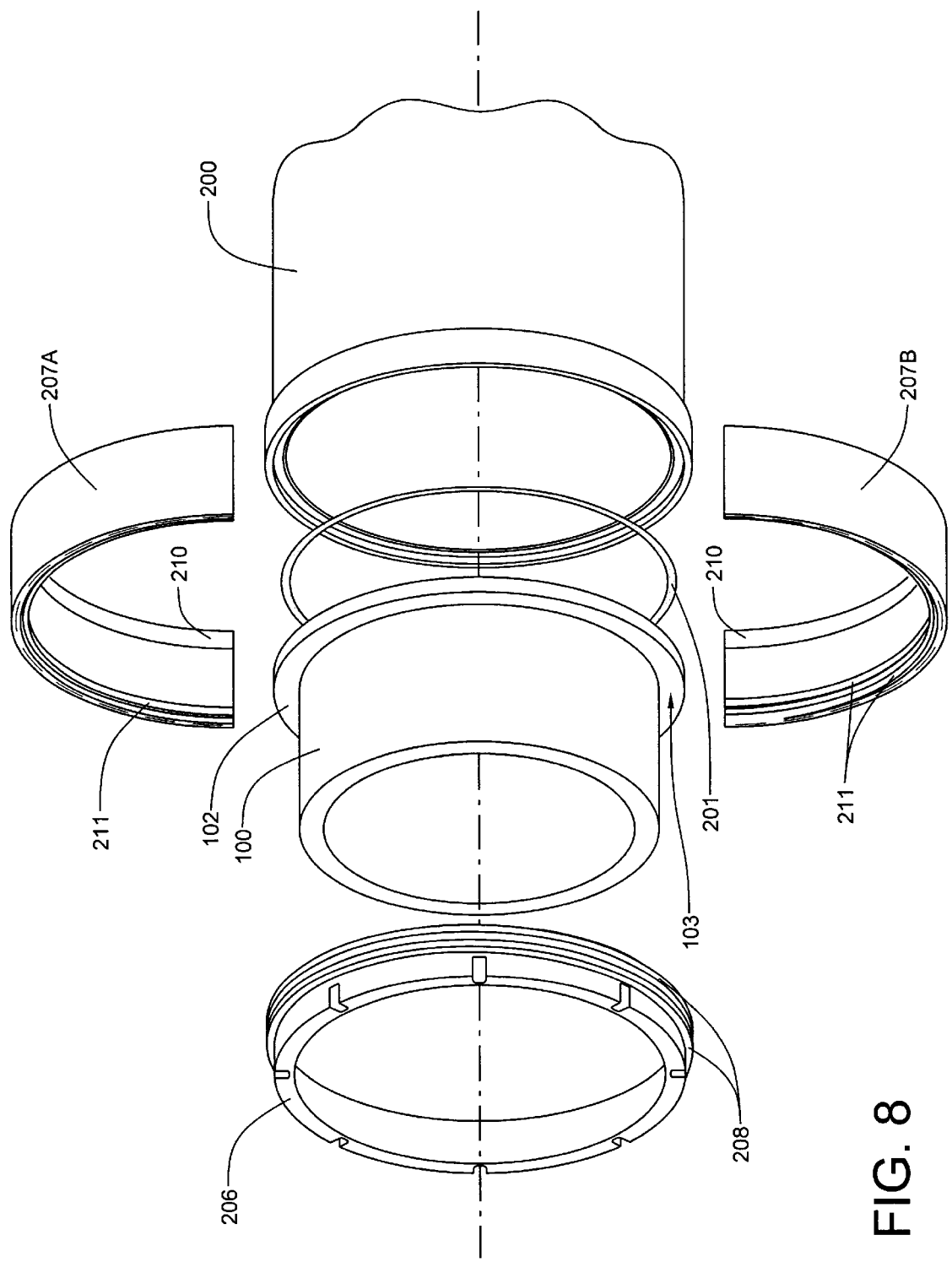
FIG. 8 is an exploded view of the improved target, the spindle and the attachment apparatus components.

Referring now to FIG. 8, the entire support spindle/target assembly and attachment apparatus are shown in an exploded view. From this view and the foregoing description and explanation, the function of the various components should be quite clear. It should also be evident that the disclosed spindle attachment apparatus is capable of rapidly and effectively coupling the improved target 200 to the support spindle 100.

For a presently preferred embodiment of the invention, the retainer ring is fabricated from No. 303 stainless steel, while the target 200 and the split clamping collar halves 207A/207B are fabricated from No. 304 stainless steel. This dissimilarity of materials helps prevent galling as an engaging force is exerted between the retainer ring threads 208 and the split clamping collar threads 211. Although the target 200, including the lip 202 and circumferential shoulder 204 can conceivably be machined from a solid stainless steel billet (a first construction method), a far more economical method of construction is to fabricate the lip 202 and shoulder 204 as a unitized annular component and then attach the annular component to a stainless steel target tube. At least three methods are presently contemplated for accomplishing this goal.

Figure 10:
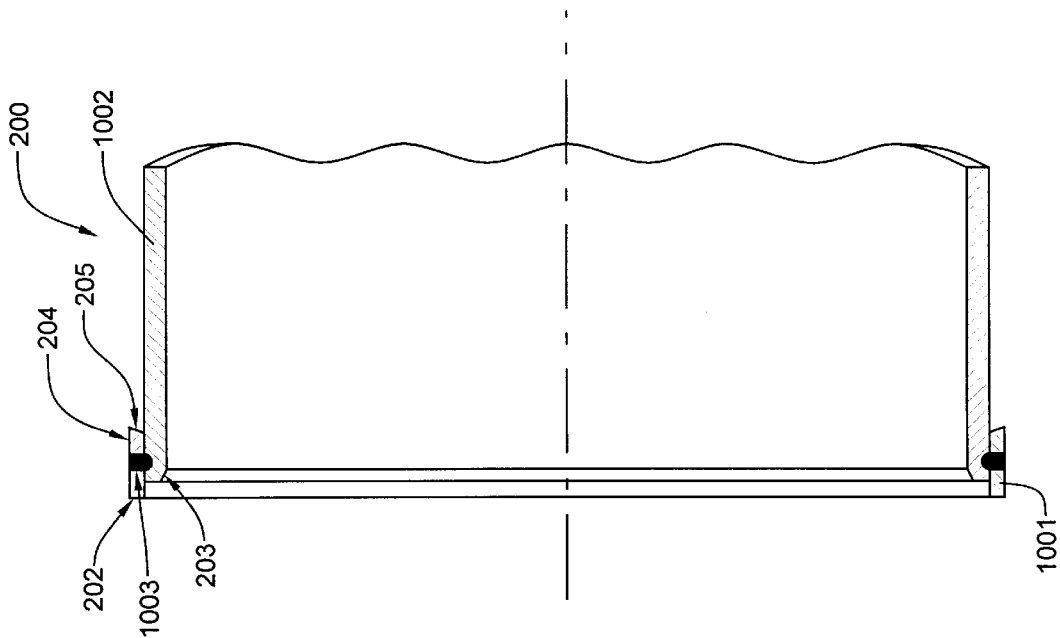
FIG. 10 is a cross-sectional view of a two-piece third embodiment target.
Figure 9:
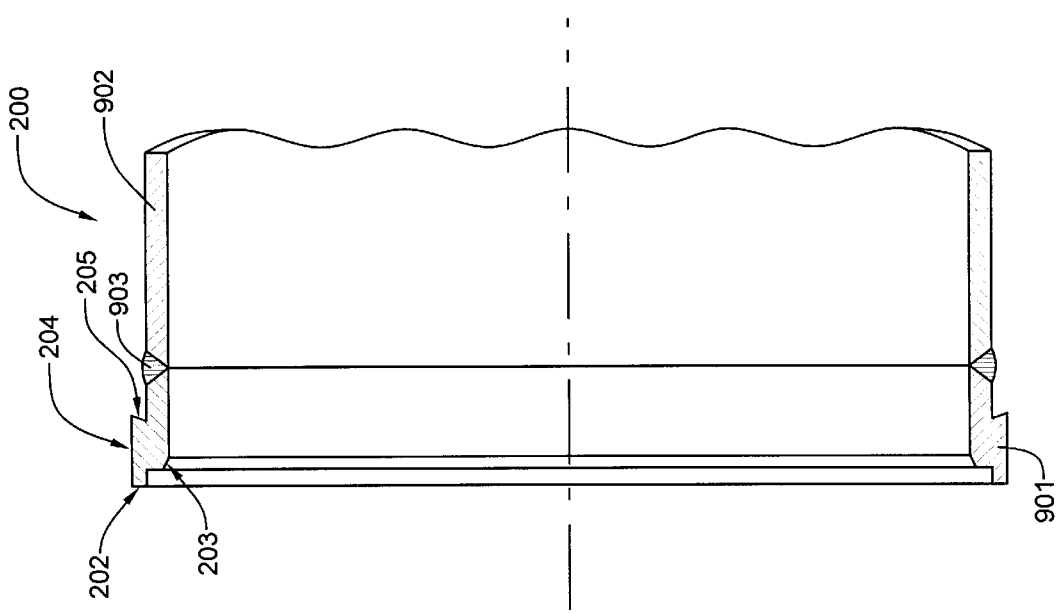
FIG. 9 is a cross-sectional view of a two-piece, second embodiment target.

FIG. 9 demonstrates a second target construction method. A first annular component 901, which incorporates the lip 202, the shoulder 204 and the overhanging step 205 is butt-welded to a first embodiment target tube 902 at union 903. FIG. 10 demonstrates a second target construction method. A second annular component 1001 is slipped over and affixed to a target tube 1002 at plug welds 1003.

FIG. 10 is demonstrative of a third target construction method, which may be accomplished with or without heat-induced expansion of a second annular component 1001. In other words, the second annular component 1001 may be diametrically sized so that it slides over a stainless steel second embodiment target tube 1002 with a slight interference fit, or sized so that its diameter is smaller than that of the target tube. The annular component may then be expanded in size by heating, slipped over the target tube 1002 and allowed to cool to ambient temperature. The shrink/interference fit may be augmented by welded plugs 1003, which unite the second annular component 1001 and the second embodiment target tube 1002.

Figure 12:
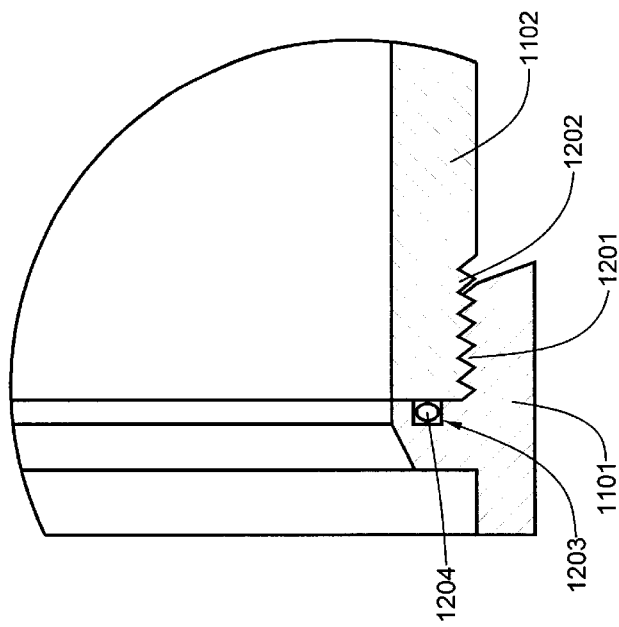
FIG. 12 is a enlarged view of the circular area 12 of FIG. 11.
Figure 11:
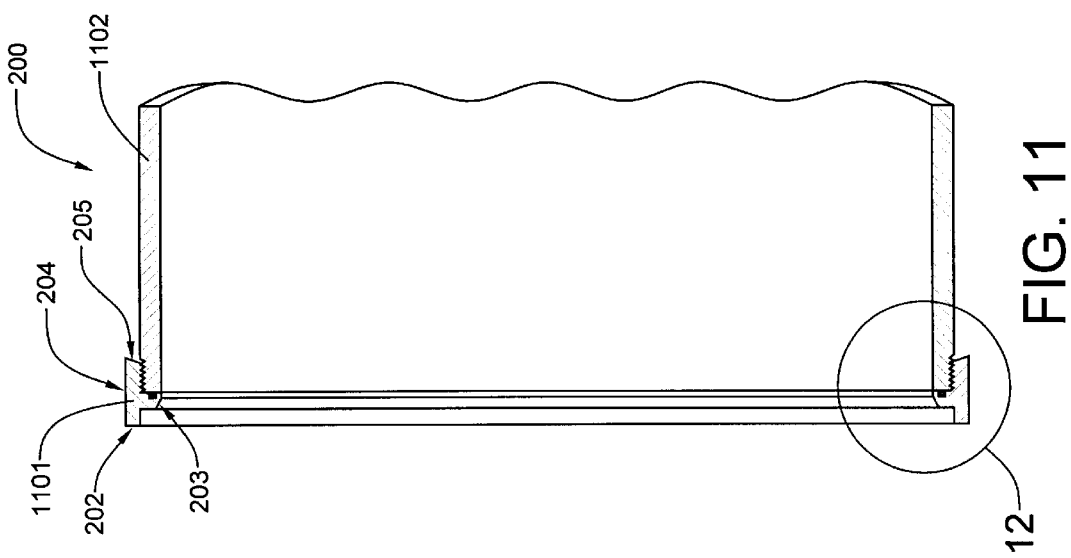
FIG. 11 is a cross-sectional view of a two-piece fourth embodiment target.

FIGS. 11 and 12 illustrate a fourth target construction method. A third annular component 1101 is equipped with internal threads 1201, while a third embodiment target tube 1102 is equipped with external threads 1201, which mate with the internal threads 1201. An O-ring groove 1203 in the third annular component 1101 is sized to receive an O-ring 1204, which seals the joint between the third annular component 1101 and the third embodiment target tube 1102.

Although only several embodiments of the invention are shown and described herein, it will be obvious to those having ordinary skill in the art that changes and modifications may be made thereto without departing from the scope and the spirit of the invention as hereinafter claimed.

What is claimed is:

1. An apparatus for affixing a cylindrical magnetron target to a rotatable support spindle, said apparatus comprising:

a support spindle including a target attachment flange, said flange having both a rear face and a front face which incorporates a circumferential seal retention groove;

an O-ring seal which fits into the seal retention groove, a circumferential portion of said seal extending beyond said groove;

a cylindrical target having a spindle attachment end which mates with said target attachment flange, said spindle attachment end having a circumferential sealing surface which contacts said circumferential portion of said seal, said spindle attachment end also having a circumferential shoulder which terminates in an inwardly-angled, overhanging circumferential step that faces away from said spindle attachment end;

a clamping collar comprised of arcuate segments, which are collectively sized to generally and coaxially surround said target attachment flange and said circumferential shoulder, said collar incorporating, both an inwardly-angled clamping ledge that engages the overhanging step of the target, and at least one internal spiral, circumferential thread spaced apart from said clamping ledge which overhangs and is angled away from said rear face; and a retainer ring sized so as to be slidable over the spindle, and rotatable against the rear face of the target attachment flange, said retainer ring incorporating external, spiral, circumferential threads that are angled away from the target attachment flange, the external threads of said retainer ring engaging the internal threads of said clamping collar to draw the clamping ledge and engaged target toward the flange and compress the O-ring seal as the retainer ring is rotated in a thread engaging direction.

2. The apparatus of claim 1, wherein the external threads of said retainer ring and the internal threads of said clamping collar are generally of parallelogram cross section.

3. The apparatus of claim 1, wherein said clamping collar is comprised of a pair of generally 180-degree arcuate segments.

4. The apparatus of claim 1, wherein said cylindrical target further comprises a circumferential lip at a spindle attachment end thereof, said lip fitting over a front edge of said target attachment flange.

5. The apparatus of claim 4, wherein said circumferential lip is proximate said sealing surface in order to afford the latter protection against mechanical damage.

6. The apparatus of claim 4, wherein the lip, shoulder and overhanging step are fabricated as a unitized annular component that is subsequently attached to a cylindrical tube to form the cylindrical target.

7. The apparatus of claim 6, wherein said unitized annular component is slipped over and plug-welded to the cylindrical tube.

8. The apparatus of claim 6, wherein said unitized annular component is butt-welded to the end of a cylindrical tube.

9. The apparatus of claim 6, wherein an end of said cylindrical tube is equipped with circumferential male threads, and said unitized annular component is equipped with circumferential female threads which engage the male threads of the target tube to unite the two components.

10. The apparatus of claim 1, wherein said retainer ring is equipped with a plurality of spanner wrench engagement recesses about its periphery.

11. An apparatus for affixing a cylindrical magnetron target to a rotatable support spindle, said apparatus comprising:
a support spindle including a target attachment flange, said flange having both a rear face and a front face;
a cylindrical target having a spindle attachment end which mates with said target attachment flange, said spindle attachment end having a circumferential shoulder which terminates in an inwardly-angled, overhanging circumferential step that faces away from said spindle attachment end;
a clamping collar comprised of arcuate segments, which are collectively sized to generally and coaxially surround said target attachment flange and said circumferential shoulder, said collar incorporating, both an inwardly-angled clamping ledge that engages the overhanging step of the target, and at least one internal spiral, circumferential thread spaced apart from said clamping ledge which overhangs and is angled away from said rear face; and
a retainer ring sized so as to be slidable over the spindle, and rotatable against the rear face of the target attachment flange, said retainer ring incorporating external, spiral, circumferential threads that are angled away from the target attachment flange, the external threads of said retainer ring engaging the internal threads of said clamping collar to draw the clamping ledge and engaged target toward the flange as the retainer ring is rotated in a thread engaging direction.

12. The apparatus of claim 11, wherein:
said front face incorporates a circumferential seal retention groove;
said apparatus further comprises an O-ring seal which fits into the seal retention groove, a circumferential portion of said seal extending beyond said groove;
said attachment end incorporates a circumferential sealing surface which contacts said circumferential portion of said seal; and
said O-ring seal is compressed by said circumferential sealing surface as the target is drawn toward the flange.

13. The apparatus of claim 11, wherein the internal threads of said retainer ring and the external threads of said clamping collar are generally of parallelogram cross section.

14. The apparatus of claim 11, wherein said clamping collar is comprised of a pair of generally 180-degree arcuate segments.

15. The apparatus of claim 11, wherein said cylindrical target further comprises a circumferential lip at a spindle attachment end thereof, said lip fitting over a front edge of said target attachment flange.

16. The apparatus of claim 15, wherein the lip, shoulder and overhanging step are fabricated as a unitized annular component that is heated and slipped over a cylindrical tube that is at a lower temperature than that of the unitized annular component, to create a heat-shrink interference unification of the unitized annular component and the target tube, thereby forming the cylindrical target.

17. The apparatus of claim 15, wherein the lip, shoulder and overhanging step are fabricated as a unitized annular component that is slipped over and plug-welded to a cylindrical tube to form the cylindrical target.

18. The apparatus of claim 15, wherein the lip, shoulder and overhanging step are fabricated as a unitized annular component that is butt-welded to an end of a cylindrical tube to form the cylindrical target.

19. The apparatus of claim 16, wherein the lip, shoulder and overhanging step are fabricated as a unitized annular component that is provided with circumferential female threads, the female threads engaging male threads cut into an end of a cylindrical tube, thereby uniting the unitized annular component and the cylindrical tube to form the cylindrical target.

20. The apparatus of claim 11, wherein said retainer ring is equipped with a plurality of spanner wrench engagement recesses about its periphery.

* * * * *